US005953580A

United States Patent [19]

Kang et al.

[11] Patent Number: 5,953,580

[45] Date of Patent: Sep. 14, 1999

[54] METHOD OF MANUFACTURING A VACUUM DEVICE

[75] Inventors: Sung Weon Kang; Jin Ho Lee; Kyoung Ik Cho; Hyung Joun Yoo, all of Daejon-Shi, Rep. of Korea

[73] Assignee: Electronics and Telecommunications Research Institute, Taejon, Rep. of Korea

[21] Appl. No.: 08/925,197

[22] Filed: Sep. 8, 1997

[30] Foreign Application Priority Data

Sep. 10, 1996 [KR] Rep. of Korea .................... 96-39064

[51] Int. Cl.[6] ............................................ H01L 20/100

[52] U.S. Cl. ............................ 438/20; 445/24; 445/50

[58] Field of Search ..................... 445/24, 50; 313/309, 313/336; 438/20

[56] References Cited

U.S. PATENT DOCUMENTS

| | | | |
|---|---|---|---|
| 5,150,192 | 9/1992 | Greene et al. | 357/68 |
| 5,228,877 | 7/1993 | Allaway et al. . | |
| 5,481,156 | 1/1996 | Lee et al. . | |
| 5,483,118 | 1/1996 | Nakamoto et al. . | |
| 5,576,594 | 11/1996 | Toyoda et al. . | |
| 5,643,032 | 7/1997 | Cheng et al. . | |
| 5,749,762 | 5/1998 | Nakamoto et al. . | |
| 5,827,099 | 12/1995 | Spindt et al. . | |

*Primary Examiner*—John F. Niebling
*Assistant Examiner*—Jonathan Hack
*Attorney, Agent, or Firm*—Cohen, Pontani, Lieberman & Pavane

[57] ABSTRACT

A method of manufacturing a vacuum device utilizing a sputtering process is disclosed. According to the present invention, the vacuum device includes a silicon substrate. An emission electrode having a sharp ended tip is formed by etching the silicon substrate. An insulating layer is formed on the silicon substrate so as to make the entire structure of the emission electrode to be exposed, with the emission electrode being surrounded by the insulating layer. A gate electrode is then formed adjacent to the sharp ended tip of the emission electrode. According to the present invention, it has advantages that the emission electrode is manufactured by forming the silicon pillar using the isotropic etching and anisotropic etching and the gate electrode can be easily formed adjacent to the emission electrode by using the sputtering method after the gate insulating layer is formed. Further, the distance between the emission electrode and the gate electrode may be easily adjusted, and the vacuum device may be operated with the desired voltage by controlling the distance between the emission electrode and the gate electrode of the vacuum device.

10 Claims, 4 Drawing Sheets

METHOD OF MANUFACTURING A VACUUM DEVICE

BACKGROUND OF THE INVENTION

1. Field of the Invention

The present invention relates to a method of manufacturing a vacuum device utilizing a sputtering process, and more particularly, to a method of manufacturing a vacuum device which is operated by applying an electric field to an electrode such that electrons is emitted from the electrode (hereinafter, referred to an emitting electrode or cathode electrode) in the presence of a vacuum or a specific gas.

2. Description of the Related Art

In general, the efficiency of a vacuum device using an electron emission depends on the shape of emitting electrodes. That is, in order to converge the electric field into the end of the emitting electrodes, the emitting electrodes are important parameters to obtain a high electric field on how the end of the emitting electrodes is sharpen and on how the emitting electrodes are closely positioned to a gate electrode which excites the emitting electrodes. Therefore, the more the end of the emitting electrodes is sharpen and the emitting electrodes are closed to the gate electrode, the more the improved efficiency of the vacuum device can be manufactured. This is a measure which is capable of lowering the drive voltage of the device. Further, it has an advantages that the drive circuit is simplified and the drive circuit by the high voltage is not necessary.

Now, the problem of the vacuum device in the prior art will now be described with reference to FIGS. 1A and 1B more in detail.

FIG. 1A illustrates a silicon-type electric field emission device of the conventional vacuum device. In Fig. 1A, it represents that an emission electrode 2 is formed on a silicon substrate 1 by an isotropic etching method. An insulating layer 3 is formed on a portion of the silicon substrate 1 and a gate electrode 4 is then formed on the insulating layer 3 using Molybdenum(Mo), Tungsten(W) or a metal having a high melting point, as shown in FIG. 1A, such that in use an electric field is applied to the emission electrode 2.

According to the structure, there is a problem that the distance between the emission electrode and the gate electrode must exceed the size of the minimum tolerance of the mask pattern used when the silicon substrate is etched by using the isotropic etching method.

Referring now to FIG. 1B, it illustrates a metal-type electric field emission device of the conventional vacuum device. In the drawing, an emission electrode 2 is formed on an insulating substrate 5 made of a silicon or a glass by a vacuum evaporating deposition method. An insulating layer 3 is formed on a portion of the insulating substrate 5 and a gate electrode 4 is then formed on the insulating layer 3 using Mo, W or metal having a high melting point, as shown in the drawing. According to the structure, the insulating layer 3 is formed and a predetermined mask pattern is defined thereon first. The sharp ended emission electrode 2 is then formed in the pattern so defined by forming the gate electrode 4 by an electron-beam deposition method using Mo, W or the metal having a high melting point.

In this embodiment of the conventional structure, a problem still exists that the distance between the emission electrode and the gate electrode must exceed the size of the minimum tolerance of the mask pattern as previously described above.

But In view of the aspect of improving the operational characteristics of the device, since the distance between the emission electrode and the gate electrode is influenced directly to the electric field which determine the emission current, a need exists that the distance between the emission electrode and the gate electrode should be minimized. Therefore, a problem is encountered that to minimize the distance between the emission electrode and the gate electrode will make the manufacturing process for forming the fine mask pattern more complicated. This further requires an expensive apparatus for forming the fine mask pattern and even with the use of the apparatus, it is so difficult to obtain an uniform distance therebetween.

It is therefore an object of the invention to provide a method of manufacturing a vacuum device utilizing a sputtering process in which a gate electrode so formed can be easily closed to the emission electrode using the sputtering method and the vacuum device can be operated with the desired low voltage by controlling the distance between the emission electrode and the gate electrode.

SUMMARY OF THE INVENTION

For the purpose of summarizing the present invention, the method for manufacturing the structure of a vacuum device comprises the steps of preparing a silicon substrate. An oxide layer is deposited on the silicon substrate. The pattern for formed of emission electrode is defined by removing a portion of the oxide layer. The mask is formed by etching the predetermined oxide layer by designed pattern A silicon pillar having a surface is formed by removing the silicon substrate using the oxide layer mask. The surface of the silicon pillar oxidized so as to make an end portion of the silicon pillar to be sharpen. A silicon nitride layer used as an etching stop layer deposited on the oxide layer mask. An insulating layer and a photoresistive layer is deposited on the entire structure. A predetermined portion of the photoresistive layer is removed to expose a portion of the insulating layer over the silicon pillar. The exposed portion of the insulating layer over the silicon pillar is removed until the surface of the silicon nitride layer for the etching stop layer is exposed and the silicon nitride layer is then removed. The remaining photoresistive layer used as the mask layer is completely removed. A material for gate electrode is deposited on the entire surface of the resulting structure to thereby position the gate electrode material on the insulating layer and into the end portion of the silicon pillar below the oxide layer mask. A gate electrode is formed on the insulating layer by selectively removing the gate electrode material formed on the oxide layer mask. An emission electrode is formed by removing the insulating layer and the oxide layer mask formed on the silicon pillar, such that a sharp ended tip of the emission electrode is formed to be exposed and the entire structure of the emission electrode is almost covered by the gate electrode except for the exposed sharp ended tip of the emission electrode.

BRIEF DESCRIPTION OF THE DRAWINGS

The present invention will become more apparent upon a detailed description of the preferred embodiments for carrying out the invention as rendered below:

FIGS. 1A and 2B are sectional views representing an electric field emission silicon device of the conventional vacuum device;

The operation of the embodiment of the present invention as discussed above w ill now be described in detail.

DETAILED DESCRIPTION OF THE INVENTION

A vacuum device according to the present invention will now be described with reference to FIG. 2.

Figure 1A:
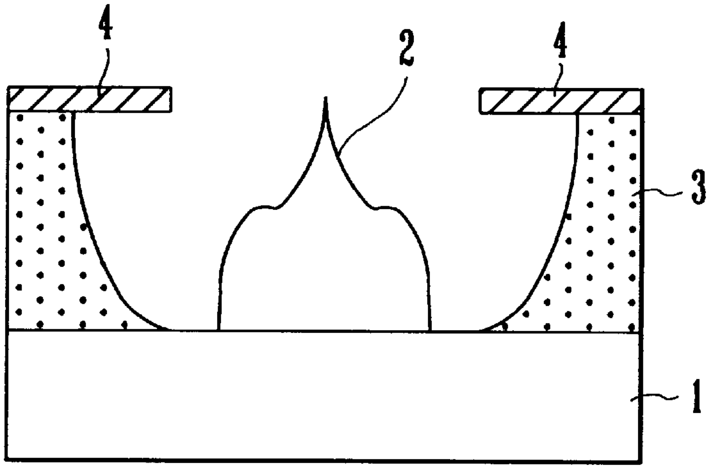
Figure 1B:
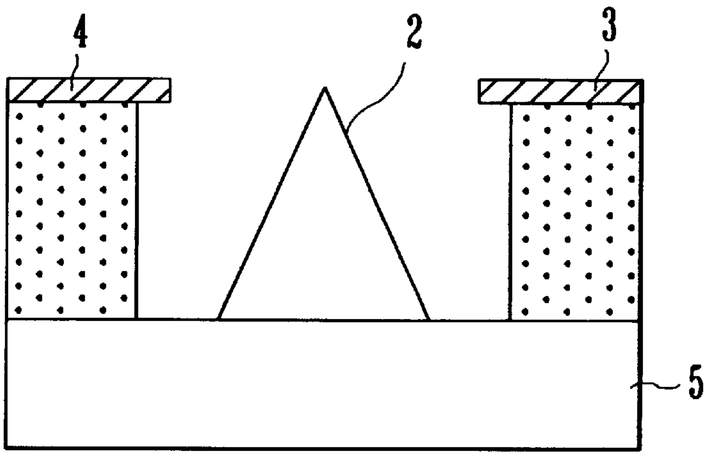
Figure 2:
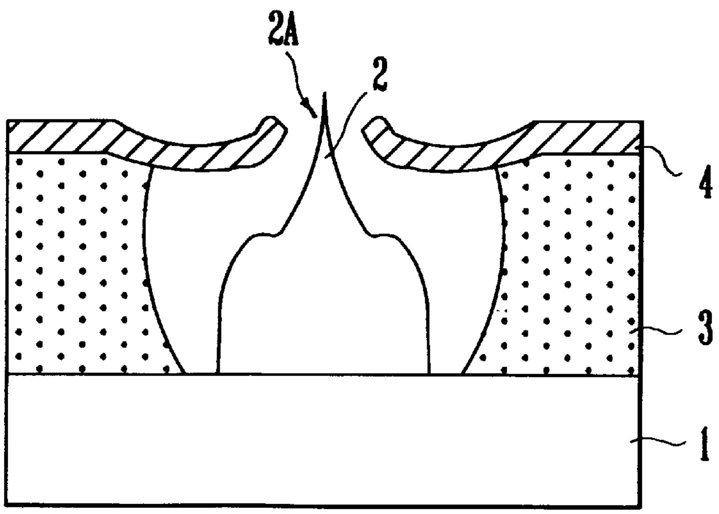
FIG. 2 is sectional view showing an electric field emission silicon device according to the present invention.

Referring now to FIG.2, it is sectional view showing an electricfield emission silicon device. According to the present invention an emission electrode 2 is formed by dry etching process or wet etching a silicon substrate 1 using a predetermined etching mask pattern, not shown in the drawing. An TEOS oxide layer or insulating layer 3 is then formed on the silicon substrate 1 so as to make the entire structure of the emission electrode 2 to be exposed and the emission electrode 2 to be surrounded by the insulating layer 3. A gate electrode 4 is formed on the insulating layer 3 and adjacent to a sharp ended tip 2A of the emission electrode 2 such that the sharp ended tip 2A of the emission electrode 2 is formed to be exposed and the entire structure of the emission electrode 2 is almost covered by the gate electrode 4 except for the exposed sharp ended tip 2A of the emission electrode 2.

In accordance with the conventional method of manufacturing the emission electrode, if the gate electrode is formed at the structure as shown, using an electron-beam deposition method, a shade region is produced in the lateral direction due to the mask used to form the emission electrode 2, such that the maximum width of the mask is the opening width of the gate electrode 4. Thus, the width between the gate electrode 4 and emission electrode 2 become more bigger as compared to the original width of the mask. However, if the gate electrode 4 is formed using a sputtering method, since the method has a superior fluidity among the methods of forming a film layer, the gate electrode 4 is formed not only on the insulating layer 3 and but also into the desired portion of the end portion 2A of the emission electrode 2, such that the gate electrode 4 can be formed adjacent to the emission electrode 2, as shown in the drawing. Therefore, there is an advantage according the inventive structure that the distance between the gate electrode 4 and emission electrode 2 can be controlled by the process of forming a thermal oxide layer which makes the emission electrode 2 to be sharpen and the additional process of depositing the insulating layer at a predetermined thickness thereof, the description of which will be fully explained hereinafter.

Now, a method for manufacturing the vacuum device shown in FIG. 2 will described more in detail with reference to FIGS. 3A to 3F.

Figure 3A:
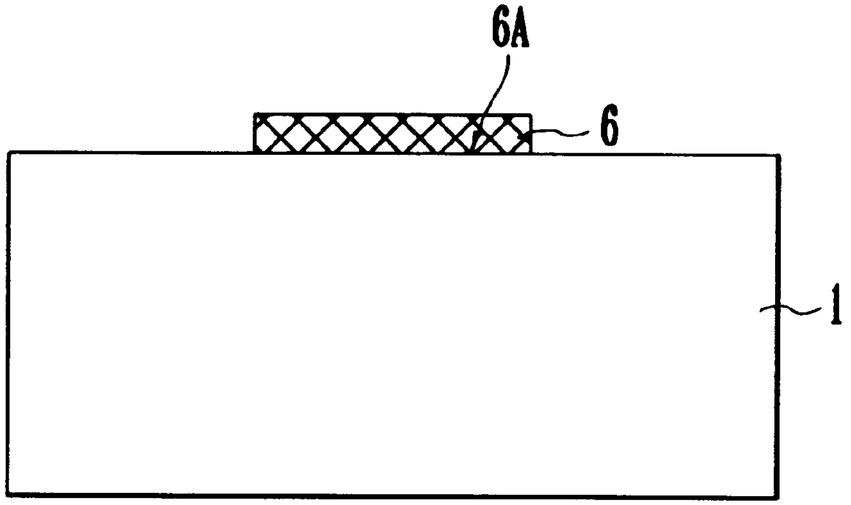
FIGS. 3A and 3B are sectional views sequentially illustrating the steps of manufacturing a vacuum device according to the present invention.
Figure 3B:
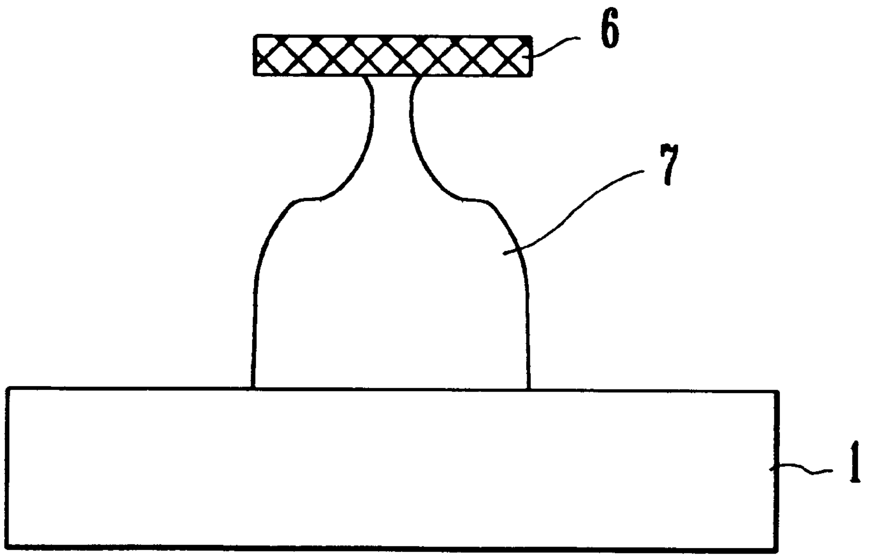

Referring now to FIG. 3A, it represents that an first oxide layer 6A is deposited on a silicon substrate 1. A portion of the oxide layer 6A is removed by a predetermined etching process to define a oxide layer mask 6 as shown in the drawing. FIG. 3B shows that the silicon substrate 1 is removed by a dry etching process or an wet etching process using the oxide layer mask 6 to form a silicon pillar 7.

Figure 3C:
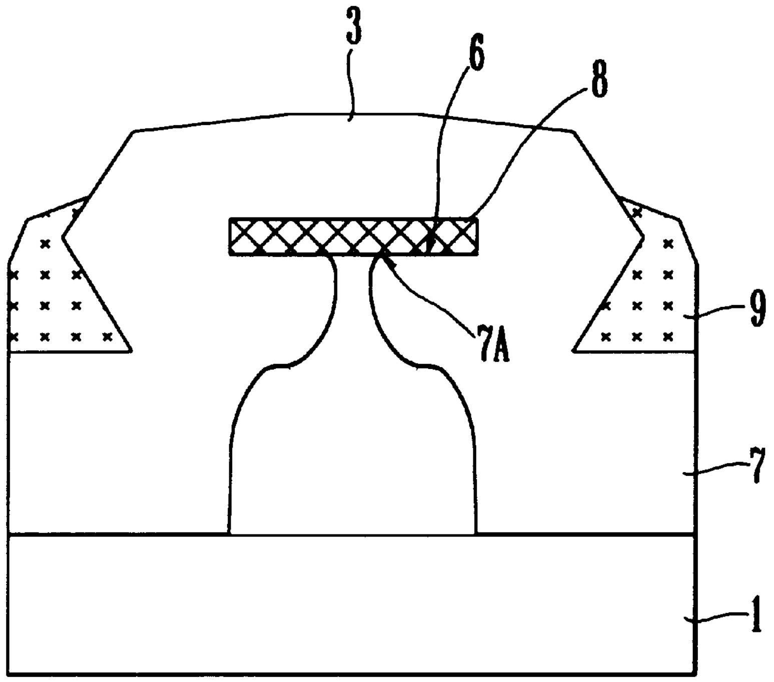
Figure 3D:
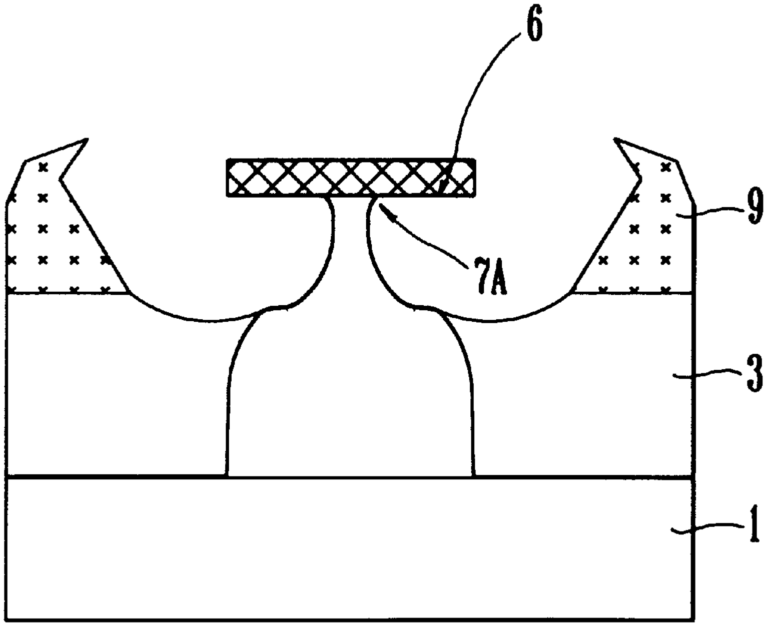
Figure 3E:
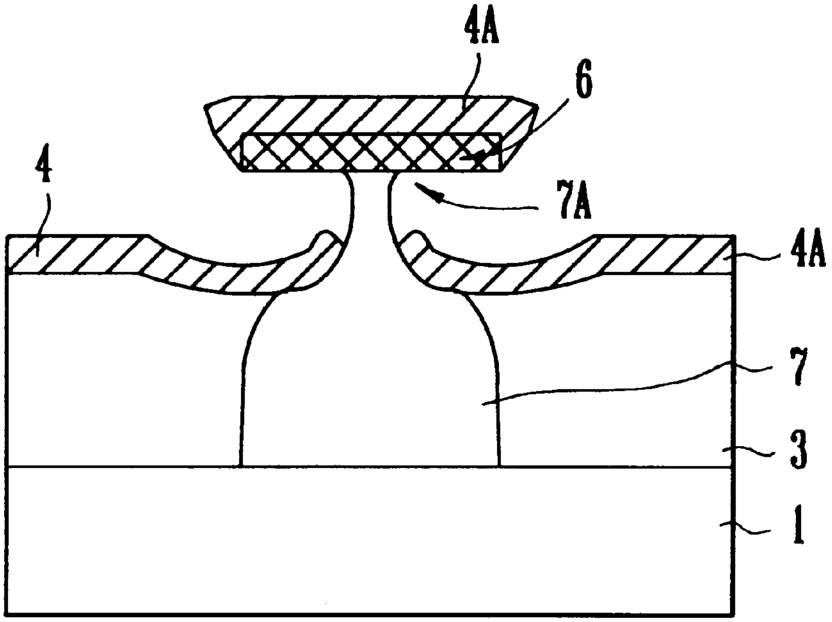

The oxide layer mask 6 is then developed by thermally oxidizing the surface of the silicon pillar 7 using a thermal oxidation process at a high temperature, as shown in FIG. 3C. The silicon pillar 7 is further oxidized such that an end portion 7A of the silicon pillar 7 is completely oxidized to become the silicon pillar 7 to be sharpen. A silicon nitride layer 8 used as an etching stop layer and a TEOS or similar insulating oxide layer 3 are then deposited on the entire surface of the resulting structure using a film deposition process. A photoresistive layer 9 is deposited on the insulating layer 3 and a predetermined portion of the photoresistive layer 9 is then removed to expose a portion of the insulating layer 3 over the silicon pillar 7, as shown in the drawing. FIG. 3D illustrates that the exposed portion of the insulating layer 3 over the silicon pillar 7 is removed using an etchant of fluoric acid until the surface of the silicon nitride layer 8 for the etching stop layer is exposed, and the silicon nitride layer 8 is then removed. In FIG. 3E, the remaining photoresistive layer 9 used as a mask layer in the etching process at FIG. 3D is completely removed. A material for gate electrode 4A, for example, metal, metal compound, silicide family electrode material or etc., is deposited on the entire surface of the resulting structure using a sputtering method which has a superior fluidity among the methods of forming a film layer, so that the gate electrode material 4A is formed on the insulating layer 3 and into the end portion 7A of the silicon pillar 7 below the oxide layer mask 6. In consideration of the conventional method, if the gate electrode is formed at the structure in FIG. 3C using an electron-beam deposition method, a shade region is produced due to the oxide layer mask 6, such that the maximum width of the oxide layer mask 6 is the opening width of the gate electrode. Thus, the width between the gate electrode and emission electrode become more bigger in comparison with the original width of the oxide layer mask 6.

Figure 3F:
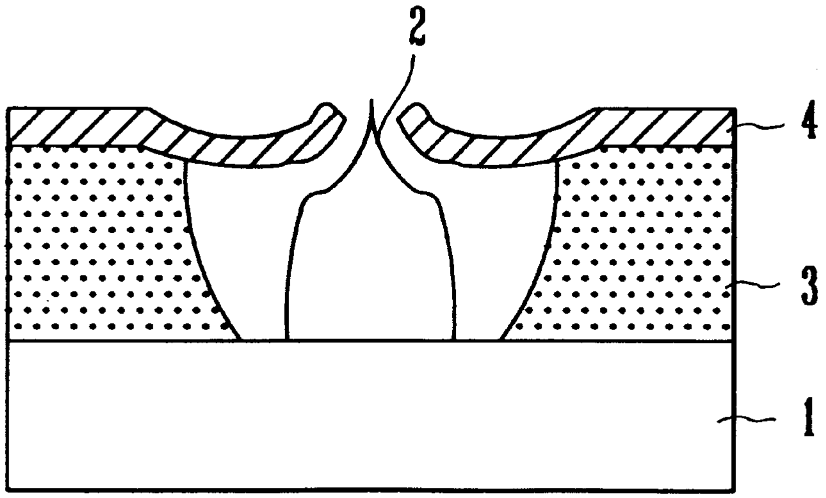

In FIG. 3F, the gate electrode material 4A on the oxide layer mask 6 is selectively removed to form a gate electrode 4 on the insulating layer 3. The insulating layer 3 and the oxide layer mask 6 formed on the silicon pillar 7 is then removed using a specific etchant of fluoric acid which has a different etch rate of the metal, metal compound or silicide family electrode material with respect to the oxide layer mask 6. As a result, a sharp ended of the silicon pillar 7 is exposed and the gate electrode of the vacuum device is completed.

As an alternative modification, when the insulating layer 3 in FIG. 3C is etched using a vapor phase etching method instead of using the etchant of fluoric acid, it has a superior advantageous effect that the etching uniformity and the interface etching characteristics can be obtained. That is, when the insulating layer 3 is etched using the echant of fluoric acid, an excessive etching may occur at the interface between the photoresistive 9 and the insulating layer 3 and the etching uniformity is deteriorated. However, if the etching process of the insulating layer 3 is performed using a vapor phase etching method, a desired etching characteristic can be obtained by etching the exposed portion of the insulating layer 3 with an uniform etching rate.

As fully described above, according to the vacuum device of the present invention, it has superior advantages that since the emission electrode can be manufactured by forming the silicon pillar using the isotropic etching and anisotropic etching methods and the gate electrode can be easily closed to the emission electrode using the sputtering method after the gate insulating layer is formed, not only the distance between the emission electrode and the gate electrode may be easily adjusted, but also the vacuum device may be operated with the desired voltage by controlling the distance between the emission electrode and the gate electrode of the vacuum device. Further, according to the present invention, an economic, stable vacuum device can be obtained by applying the semiconductor manufacturing process.

The present invention has been described with reference to a particular embodiment in connection with a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed is:

1. A method of manufacturing a structure of a vacuum device comprises the steps of:

preparing a silicon substrate;

depositing an oxide layer on the silicon substrate;

defining an oxide layer mask by removing a portion of the oxide layer;

forming a silicon pillar having a surface by removing the silicon substrate using the oxide layer mask;

oxidizing the surface of the silicon pillar to sharpen an end portion of the silicon pillar;

depositing a silicon nitride layer used as an etching stop layer on the oxide layer mask;

depositing an insulating layer and a photoresistive layer on the insulating layer;

removing a predetermined portion of the photoresistive layer to expose a portion of the insulating layer over the silicon pillar;

removing the portion of the insulating layer over the silicon pillar until the surface of the silicon nitride layer for the etching stop layer is exposed;

removing the silicon nitride layer;

completely removing the remaining photoresistive layer;

depositing a material for a gate electrode on the entire surface of the resulting structure thereby positioning the gate electrode material on the insulating layer and into the end portion of the silicon pillar below the oxide layer mask;

forming a gate electrode on the insulating layer by selectively removing the gate electrode material formed on the oxide layer mask; and forming an emission electrode from the silicon pillar by removing the insulating layer and the oxide layer mask formed on the silicon pillar such that a sharp ended tip is formed on the silicon pillar and the entire structure of the silicon pillar is almost covered by the gate electrode except for the sharp ended tip of the silicon pillar.

2. The method of manufacturing a structure of the vacuum device according to claim 1, wherein the silicon pillar is formed by removing the silicon substrate using either a dry etching or an wet etching.

3. The method of manufacturing a structure of the vacuum device according to claim 1, wherein the step of oxidizing the surface of the silicon pillar is developed using a thermal oxidation process at a high temperature.

4. The method of manufacturing a structure of the vacuum device according to claim 1, wherein the step of depositing a silicon nitride layer uses a film layer deposition process.

5. The method of manufacturing a structure of the vacuum device according to claim 1, wherein the step of depositing an insulating layer uses a film layer deposition process.

6. The method of manufacturing a structure of the vacuum device according to claim 1, wherein the insulating layer is a TEOS.

7. The method of manufacturing a structure of the vacuum device according to claim 1, wherein the step of removing the portion of the insulating layer over the silicon pillar includes etching with an echant of fluoric acid.

8. The method of manufacturing a structure of the vacuum device according to claim 1, wherein the material for the gate electrode is one selected from the group consisting of a metal, a metal compound and a silicide family material.

9. The method of manufacturing a structure of the vacuum device according to claim 1, wherein the step of depositing a material for a gate electrode includes using a sputtering method.

10. The method of manufacturing a structure of the vacuum device according to claim 1, wherein the step of forming an emission electrode from the silicon pillar by removing the insulating layer and the oxide layer mask formed on the silicon pillar includes using a specific echant of fluoric acid which has a different etch rate for a metal, a metal compound or a silicide family material with respect to the oxide layer mask.

* * * * *